United States Patent
Lei et al.

(10) Patent No.: US 11,461,148 B2
(45) Date of Patent: Oct. 4, 2022

(54) FIELD-PROGRAMMABLE GATE ARRAY (FPGA) ACCELERATION RESOURCE CONSERVATION

(71) Applicant: Huawei Technologies Co., Ltd., Shenzhen (CN)

(72) Inventors: Conghua Lei, Dongguan (CN); Weijun Le, Dongguan (CN); Lei Shi, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 286 days.

(21) Appl. No.: 16/798,931

(22) Filed: Feb. 24, 2020

(65) Prior Publication Data

US 2020/0192723 A1 Jun. 18, 2020

Related U.S. Application Data

(63) Continuation of application No. PCT/CN2017/098481, filed on Aug. 22, 2017.

(51) Int. Cl.
*G06F 9/46* (2006.01)
*G06F 9/50* (2006.01)
(Continued)

(52) U.S. Cl.
CPC .............. *G06F 9/5077* (2013.01); *G06F 9/28* (2013.01); *G06F 9/4405* (2013.01); *G06F 9/455* (2013.01)

(58) Field of Classification Search
CPC ........ G06F 9/5077; G06F 9/27; G06F 9/4405; G06F 9/455; G06F 9/445; G06F 9/4843;
(Continued)

(56) References Cited

U.S. PATENT DOCUMENTS 7,389,393 B1 6/2008 Karr et al.
10,162,472 B1 * 12/2018 Joyce ................... G06F 9/454
(Continued)

FOREIGN PATENT DOCUMENTS

| CN | 101004690 A | 7/2007 |
|---|---|---|
| CN | 101788931 A | 7/2010 |

(Continued)

OTHER PUBLICATIONS

Marques, Chisel: mapping separate input and output ports to input pin, Dec. 4, 2016, Stack Overflow, pp. 1-3 (Year: 2016).*
(Continued)

*Primary Examiner* — Emerson C Puente
*Assistant Examiner* — Zhi Chen
(74) *Attorney, Agent, or Firm* — Conley Rose, P.C.

(57) ABSTRACT

In an acceleration processing method, an acceleration processing device combines a first acceleration application and a second acceleration application to obtain a first combined application, and burns the first combined application to a first acceleration resource, where the first combined application includes a top module, the first acceleration application, and the second acceleration application, and the top module includes a statement used to invoke the first acceleration application and a statement used to invoke the second acceleration application.

20 Claims, 9 Drawing Sheets

```
      600 ─╮     601 ─╮
           ╲         ╲
      module top (top1_in, top1_out, top2_in, top2_out);
           ...
604 ─╮
     ╲ aap_mid app_mid_instance (
              .top1_in (top1_in), .top1_out (top1_out),
              .top2_in (top2_in), .top2_out (top2_out),
              .aap1_in (aap1_in), .aap1_out (aap1_ out),
              .aap2_in (aap2_in), .aap2_ out (aap2_ out)
602 ─╮    );
     603 ─╮ aap1 aap1_instance (.aap1_in (aap1_in), .aap1_out (aap1_ out));
           ╲ aap2 aap2_instance (.aap2_in (aap2_in), .aap2_ out (aap2_ out));
      endmodule
```

(51) Int. Cl.
*G06F 9/28* (2006.01)
*G06F 9/4401* (2018.01)
*G06F 9/455* (2018.01)

(58) Field of Classification Search
CPC ...... G06F 9/505; G06F 9/4484; G06F 9/5044; G06F 30/34; G06F 8/60; G06F 9/28
See application file for complete search history.

(56) References Cited

U.S. PATENT DOCUMENTS

| | | | |
|---|---|---|---|
| 2004/0078179 A1* | 4/2004 | Fuji | G06F 30/331 703/15 |
| 2010/0011353 A1* | 1/2010 | Chalupa | G06F 8/61 717/177 |
| 2010/0131934 A1* | 5/2010 | Kim | G06F 30/30 717/137 |
| 2014/0229723 A1 | 8/2014 | Kalte | |
| 2017/0039089 A1 | 2/2017 | Xia et al. | |
| 2017/0124239 A1* | 5/2017 | Surendran | G06F 30/33 |
| 2017/0126487 A1 | 5/2017 | Xie et al. | |
| 2018/0293108 A1* | 10/2018 | Tang | G06F 9/5027 |
| 2018/0341524 A1* | 11/2018 | Sarma | G06F 9/4881 |
| 2020/0174841 A1* | 6/2020 | Marolia | G06F 9/5044 |

FOREIGN PATENT DOCUMENTS

| | | | | |
|---|---|---|---|---|
| CN | 102521157 A | | 6/2012 | |
| CN | 103744694 A | | 4/2014 | |
| CN | 104008024 A | | 8/2014 | |
| CN | 104951353 A | | 9/2015 | |
| CN | 105306241 A | | 2/2016 | |
| CN | 105677422 A | * | 6/2016 | ............. G06F 11/08 |
| CN | 106502633 A | | 3/2017 | |
| JP | 2010186206 A | * | 8/2010 | .......... G06F 11/1433 |

OTHER PUBLICATIONS

Aug, How to assign physical pins of FPGA to Xilinx ISE Verilog modules, Oct. 3, 2013, Electrical Engineering Stack Exchange, pp. 1-4 (Year: 2013).*

Beyond Circuits, Tutorial 1: The Simplest FPGA in the World, 2016, beyond-circuits.com, pp. 1-16 (Year: 2016).*

* cited by examiner

S401. An acceleration processing device combines a first acceleration application and a second acceleration application, to obtain a first combined application S402. The acceleration processing device burns the first combined application to a first acceleration resource

| Hardware resource type | Use quantity | Total | Utilization |
|---|---|---|---|
| Register | 9000 | 64800 | 13.89% |
| LUT | 20000 | 32800 | 60.98% |
| RAM | 68 | 90 | 75.56% |
| Input/Output port | 30 | 250 | 12% |

| Utilization list | 1011 | 1012 |
|---|---|---|
| 1001 + 1002 | 80% | 70% |
| 1001 + 1003 | 70% | 60% |
| 1002 + 1003 | 60% | 50% |
| 1001 | 45% | 40% |
| 1002 | 35% | 30% |
| 1003 | 25% | 20% |

1101 — 1101
1102 — 1102
1103 — 1103
1104 — 1104
1105 — 1105
1106 — 1106

FIELD-PROGRAMMABLE GATE ARRAY (FPGA) ACCELERATION RESOURCE CONSERVATION

CROSS-REFERENCE TO RELATED APPLICATIONS

This is a continuation of Int'l Patent App. No. PCT/CN2017/098481 filed on Aug. 22, 2017, which is incorporated by reference.

TECHNICAL FIELD

This disclosure relates to the field of communications technologies, and in particular, to an acceleration processing method and device.

BACKGROUND

A network functions virtualization (NFV) system can use a field-programmable gate array (FPGA) as a hardware accelerator, and switch function execution from software to the FPGA, to improve system performance. In the NFV system, a network functions virtualization infrastructure (NFVI) may abstract the FPGA into a group of acceleration functions (or acceleration capabilities), and provide an application programming interface (API) for a virtualized network function (VNF) or a host to invoke the acceleration functions.

The FPGA is an integrated circuit that can be configured. Different quantities or types of FPGAs need to be configured in the NFV system to provide various acceleration functions. To improve FPGA utilization, a partial reconfiguration (PR) technology may be introduced, so as to meet more requirements by using fewer FPGAs. In the PR technology, area division is performed in the FPGA, and a plurality of areas is set. An area is allowed to be reconfigured to meet a new requirement without affecting an area that is not reconfigured. A quantity of areas obtained after the division in the FPGA is limited. After the area division, allocation can be performed based on only an area, and an area size cannot be dynamically adjusted based on an actual requirement.

SUMMARY

This disclosure provides an acceleration processing method and device, to help improve acceleration resource utilization.

According to a first aspect, an acceleration processing method is provided. In the method, an acceleration processing device combines a first acceleration application and a second acceleration application to obtain a first combined application, and burns the first combined application to a first acceleration resource. The first acceleration application, the second acceleration application, and the first combined application may be HDL code, and the first acceleration resource may be an FPGA or an area in an FPGA. The first combined application includes a top module, the first acceleration application, and the second acceleration application. The top module includes a statement used to invoke the first acceleration application and a statement used to invoke the second acceleration application. In this way, after the first combined application is burnt to the first acceleration resource, the first acceleration resource can execute both an invocation request for the first acceleration application and an invocation request for the second acceleration application. In the method in which the acceleration processing device burns the combined application to the acceleration resource after obtaining the combined application by combining the acceleration applications, acceleration resource utilization is improved relative to a manner in which only a single acceleration application is burnt to an acceleration resource.

Optionally, the top module includes a first port and a second port, and the first port and the second port are respectively mapped to a port of the first acceleration application and a port of the second acceleration application. In this way, the top module may be separately connected to the first acceleration application and the second acceleration application to transmit a signal, and signals on the first port and the second port do not affect each other. This is convenient for implementation.

Optionally, the top module includes a first port, and the first port is mapped to both a port of the first acceleration application and a port of the second acceleration application. In this way, the port of the top module may be connected to both the port of the first acceleration application and the port of the second acceleration application, and then a signal is transmitted in a bus manner. This port mapping manner helps keep an original port connection relationship when a new acceleration application is added, and facilitates upgrading.

Optionally, before the acceleration processing device burns the first combined application to the first acceleration resource, the second acceleration application is burnt to a second acceleration resource. After the acceleration processing device burns the first combined application to the first acceleration resource, the second acceleration application is migrated from the second acceleration resource to the first acceleration resource. Subsequently, a trigger instruction may be sent to only the first acceleration resource to trigger the first acceleration resource to execute the second acceleration application, and no trigger instruction is sent to the second acceleration resource to trigger the second acceleration resource to execute the second acceleration application. An acceleration application that has been burnt to an acceleration resource is migrated to a new acceleration resource. In the new acceleration resource, the acceleration application is combined with another acceleration application. This helps achieve higher utilization of an existing acceleration resource. In an NFV system, this helps meet more requirements with fewer FPGAs.

Optionally, before the acceleration processing device burns the first combined application to the first acceleration resource, the second acceleration application is burnt to the first acceleration resource. In a process in which the acceleration processing device burns the first combined application to the first acceleration resource, when there is an invocation request for the second acceleration application, the acceleration processing device may replace the first acceleration resource to execute the second acceleration application. In this way, an invocation request for an acceleration application on an acceleration resource being used for burning in the burning process can be responded in a timely manner.

Optionally, before burning the first combined application to the first acceleration resource, the acceleration processing device determines that utilization of using the first acceleration resource by the first combined application is higher than utilization of using a third acceleration resource by the first combined application. In this way, when there are a plurality of acceleration resources that can be used for burning, selection may be performed based on utilization of using an acceleration resource by a combined application. This helps improve acceleration resource utilization.

Optionally, before combining the first acceleration application and the second acceleration application, the acceleration processing device first obtains a plurality of acceleration applications including the first acceleration application and the second acceleration application, and burns the first combined application to the first acceleration resource according to a preferential allocation scheme in a plurality of allocation schemes. Each of the plurality of allocation schemes is a correspondence between a plurality of acceleration resources and the plurality of acceleration applications, the plurality of acceleration resources include the first acceleration resource, and the preferential allocation scheme includes a correspondence between the first acceleration resource and each of the first acceleration application and the second acceleration application. The acceleration processing device may select, according to different selection policies, the preferential allocation scheme from the plurality of allocation schemes to complete burning. In this way, diversified manners of improving acceleration resource utilization are provided.

Optionally, a quantity of acceleration resources (namely, acceleration resources corresponding to at least one acceleration application) used in the preferential allocation scheme is smallest. In this way, more acceleration resources can be saved to meet a subsequent requirement for an acceleration resource.

Optionally, a sum of utilization of acceleration resources used in the preferential allocation scheme is largest. In this way, relatively high overall acceleration resource (including all acceleration resources used in the allocation scheme) utilization can be achieved.

Optionally, the acceleration processing device executes a computer program instruction to implement the acceleration processing method provided in the first aspect, and the computer program instruction may be used to implement an NFVI function. In this way, a function of performing the acceleration processing method provided in the first aspect may be added to an NFVI in an existing NFV system, so that a function of the existing NFV system is extended.

According to a second aspect, an acceleration processing device is provided. The acceleration processing device includes a unit configured to perform the acceleration processing method provided in the first aspect.

According to a third aspect, an acceleration processing device is provided. The acceleration processing device includes a memory and a processor, where the processor reads a computer program instruction stored in the memory, to perform the acceleration processing method provided in the first aspect.

Optionally, the acceleration processing device provided in the third aspect includes the first acceleration resource in the acceleration processing method provided in the first aspect.

According to a fourth aspect, an acceleration processing system is provided, including the acceleration processing device provided in the second aspect or the third aspect and the first acceleration resource in the acceleration processing method provided in the first aspect.

According to a fifth aspect, a computer storage medium including a computer program instruction is provided. When the computer program instruction runs on an acceleration processing device, the acceleration processing device performs the acceleration processing method provided in the first aspect.

According to a sixth aspect, a computer program product including a computer program instruction is provided. When the computer program instruction runs on an acceleration processing device, the acceleration processing device performs the acceleration processing method provided in the first aspect.

DESCRIPTION OF EMBODIMENTS

Figure 1:
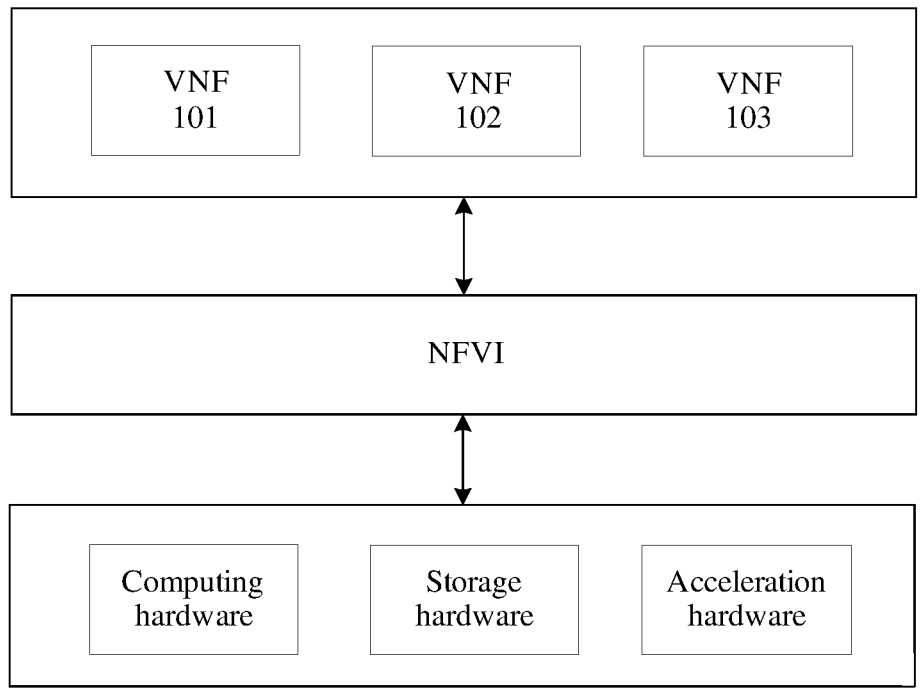
FIG. 1 is a schematic architectural diagram of an NFV system according to an embodiment.

FIG. 1 is a schematic architectural diagram of an NFV system according to an embodiment. In the NFV system, an NFVI abstracts computing hardware, storage hardware, and acceleration hardware to obtain a group of computing capabilities, a group of storage capabilities, and a group of acceleration capabilities, and provides, for a VNF 101, a VNF 102, and a VNF 103, APIs for invoking these computing capabilities, storage capabilities, and acceleration capabilities, to provide various services, such as a computing service, a storage service, and an acceleration service.

Figure 2:
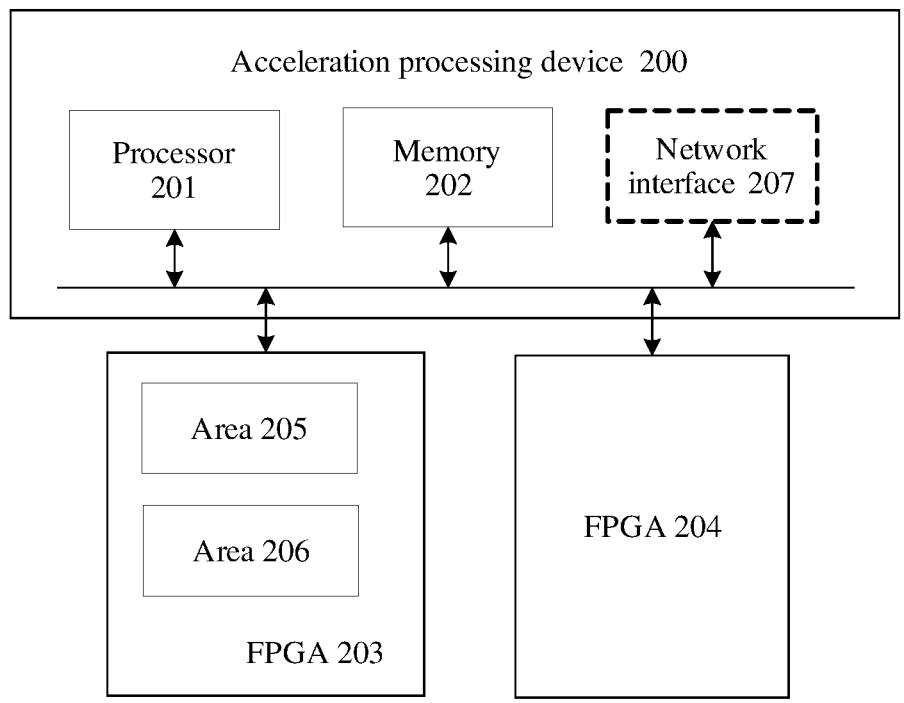
FIG. 2 is a schematic diagram of applying an acceleration processing device 200 to an NFV system shown in FIG. 1 according to an embodiment.

FIG. 2 is a schematic diagram of an acceleration processing system applying an acceleration processing device 200 to an NFV system shown in FIG. 1 according to an embodiment. The acceleration processing system includes the acceleration processing device 200 and an FPGA chip. The acceleration processing device 200 executes a computer program instruction to implement a function of an NFVI in the NFV system shown in FIG. 1. The acceleration processing device 200 includes a processor 201 and a memory 202. The processor 201 and the memory 202 may be connected by using a bus or may be directly connected. The memory 202 stores the computer program instruction, and the processor 201 reads the computer program instruction stored in the memory 202, to implement various operations of the acceleration processing device 200.

The acceleration processing device 200 may be connected to one or more FPGA chips directly or by using a bus. The FPGA chip may be divided into a plurality of areas by using a PR technology, or area division may not be performed. As shown in FIG. 2, an FPGA 203 is an FPGA chip including a plurality of areas (for example, an area 205 and an area 206), and an FPGA 204 is an FPGA chip in which no area division is performed. Alternatively, the FPGA chip may be included in the acceleration processing device 200.

The acceleration processing device 200 may obtain, from the memory, an application (referred to as an acceleration application below) that requires hardware acceleration. The acceleration application may be hardware description language (HDL) code. The HDL code describes a logical function that requires hardware acceleration, and the logical function is used to respond to invocation for an API of an acceleration capability. The acceleration processing device 200 may burn the HDL code to the FPGA chip, and then perform, when receiving the invocation for the API of the acceleration capability, a required logical function by using the FPGA chip.

A burning process may include: synthesizing the HDL code to generate a netlist, performing placement and routing based on the netlist by using a verification method such as emulation, to generate a binary file, and transmitting the binary file to the FPGA chip. For the FPGA chip including a plurality of areas, the burning may be burning the HDL code to one area in the FPGA chip. For the FPGA chip in which no area division is performed, the burning may be burning the HDL code to the entire FPGA chip. Alternatively, the acceleration processing device 200 may convert code, for example, C-language code (pre-stored or obtained from another device), of a language other than the HDL, to obtain the acceleration application.

The acceleration processing device 200 may further include a network interface 207, receive, through the network interface 207, an acceleration application sent by another network device, and burn the acceleration application to the FPGA chip. The acceleration processing device 200 may further receive, through the network interface 207, code that is sent by another device and that is of a language other than the HDL, convert the code of the language other than the HDL into an acceleration application, and then burn the acceleration application to the FPGA chip.

Figures 3, 4:
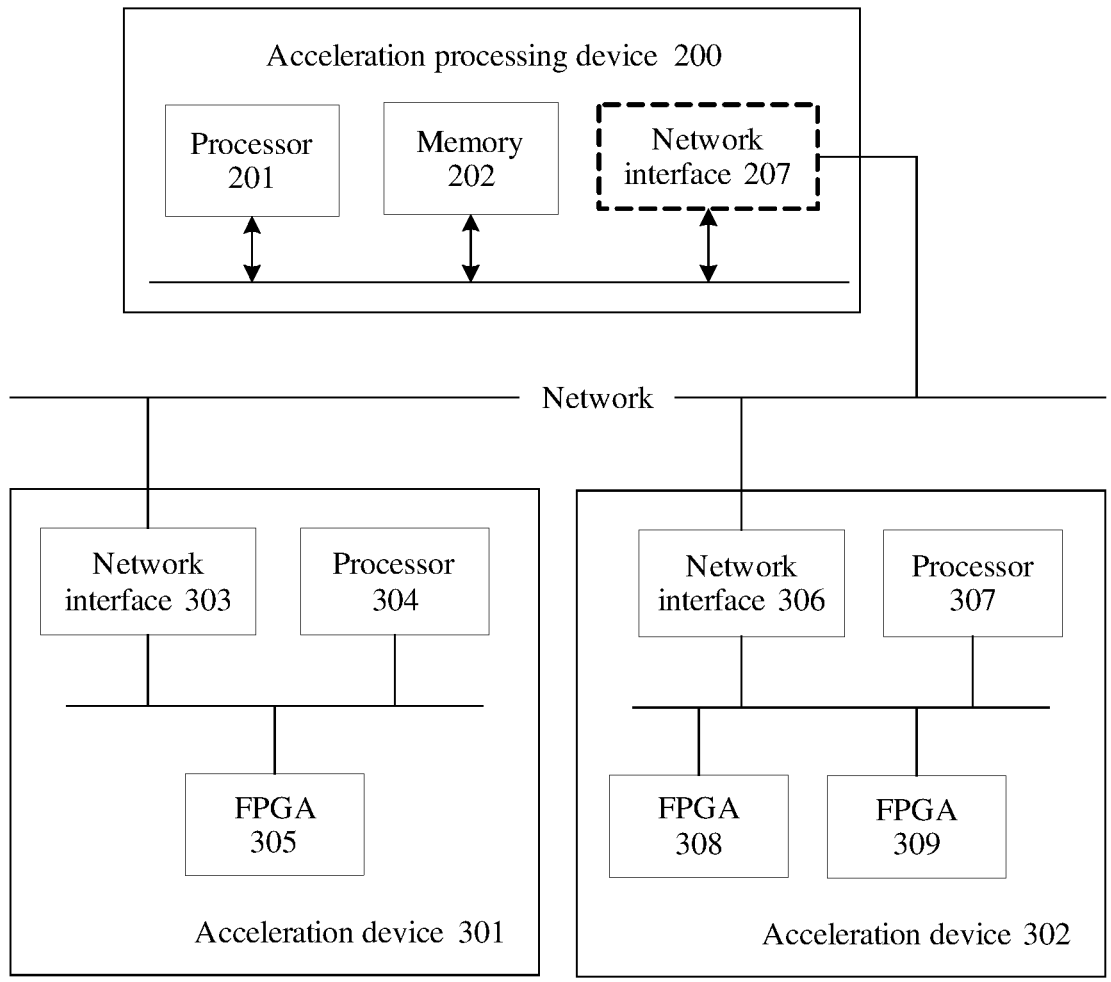
FIG. 3 is another schematic diagram of applying an acceleration processing device 200 to an NFV system shown in FIG. 1 according to an embodiment.
FIG. 4 is a flowchart of an acceleration processing method 400 according to an embodiment.

FIG. 3 is a schematic diagram of an acceleration processing system applying an acceleration processing device 200 to a system shown in FIG. 1 according to an embodiment. The acceleration processing system includes the acceleration processing device 200 and an FPGA chip. A structure of the acceleration processing device 200 in FIG. 3 is the same as that of the acceleration processing device 200 including the network interface 207 in FIG. 2. The acceleration processing device 200 may be connected to one or more acceleration devices through the network interface 207. Each acceleration device may include a network interface, a processor, and one or more FPGA chips. The FPGA chip may be the FPGA chip including a plurality of areas or the FPGA chip in which no area division is performed that is shown in FIG. 2. As shown in FIG. 3, an acceleration device 301 includes one FPGA chip: an FPGA 305. An acceleration device 302 includes two FPGA chips: an FPGA 308 and an FPGA 309. In an environment shown in FIG. 3, the acceleration processing device 200 may locally obtain an acceleration application, or receive, through the network interface 207, an acceleration application sent by another device, or receive, through the network interface 207, code that is sent by another device and that is of a language other than an HDL, and convert the code of the language other than the HDL into an acceleration application. A process in which the acceleration processing device 200 burns the acceleration application to the FPGA chip of the acceleration device 301 may include: generating, by the acceleration processing device 200, a binary file based on the acceleration application; sending the binary file to the acceleration device 301; receiving, by the acceleration device 301, the binary file through a network interface 303 under the control of a processor 304; and transmitting the binary file to the FPGA 305 (when the FPGA 305 includes a plurality of areas, the acceleration application is burnt to one area in the FPGA 305). A process in which the acceleration processing device 200 burns the acceleration application to the FPGA chip of the acceleration device 302 is similar to the process in which the acceleration processing device 200 burns the acceleration application to the FPGA chip of the acceleration device 301, and details are not described herein again.

The processors 201, 304, and 307 include but are not limited to one or more of a central processing unit (CPU), a network processor (NP), an application-specific integrated circuit (ASIC), and a programmable logic device (PLD). The PLD may be a complex programmable logic device (CPLD), an FPGA, a generic array logic (GAL), or any combination thereof.

The memory 202 may include a volatile memory for example, a random-access memory (RAM). Alternatively, the memory 202 may include a non-volatile memory, for example, a read-only memory (ROM), a flash memory, a hard disk drive (HDD), or a solid-state drive (SSD). Alternatively, the memory 202 may include a combination of the foregoing types of memories.

Optionally, the memory 202 may be integrated into the processor 201 as an internal component of the processor 201.

The network interfaces 207, 303, and 306 may be wired communications interfaces, wireless communications interfaces, or a combination thereof. For example, the wired communications interface is an Ethernet interface, an asynchronous transfer mode (ATM) interface, or a packet over synchronous digital hierarchy (SDH)/synchronous optical networking (SONET) (POS) interface. For example, the wireless communications interface is a wireless local area network (WLAN) interface, a cellular network communications interface, or a combination thereof.

FIG. 4 is a flowchart of an acceleration processing method 400 according to an embodiment. The acceleration processing method 400 may be performed by the acceleration processing device 200 in FIG. 2 and FIG. 3.

S401. The acceleration processing device combines a first acceleration application and a second acceleration application to obtain a first combined application.

The first combined application may be HDL code. A logical function described by the HDL code includes a logical function described by the first acceleration application and a logical function described by the second acceleration application. The HDL code includes code in the first acceleration application and code in the second acceleration application.

The first combined application may include a top module, the first acceleration application, and the second acceleration application. The top module, or top code, may include a statement used to invoke the first acceleration application and a statement used to invoke the second acceleration application. The statement used to invoke the first acceleration application and the statement used to invoke the second acceleration application may be a statement for instantiating the first acceleration application (in other words, establishing an instance of the first acceleration application) and a statement for instantiating the second acceleration application (in other words, establishing an instance of the second acceleration application). After the first combined application is burnt to an FPGA chip, a hardware circuit (namely, a hardware circuit corresponding to the top module) that is in the FPGA chip and that is configured to implement a logical function described by the top module is connected to a hardware circuit (namely, a hardware circuit corresponding to the first acceleration application) configured to implement the logical function described by the first acceleration application and a hardware circuit (namely, a hardware circuit corresponding to the second acceleration application) configured to implement the logical function described by the second acceleration application.

The top module, the first acceleration application, and the second acceleration application each include a port list, and the port list includes one or more ports. A port of the top module is a port of the first combined application for external communication. After the first combined application is burnt to the FPGA chip, the port of the top module is mapped to a specified pin of the FPGA chip (in other words, a port of the hardware circuit corresponding to the top module is connected to the specified pin). In this way, the hardware circuit corresponding to the top module may externally communicate with the FPGA chip by using the specified pin. The top module may map the port of the top module to a port of the first acceleration application and a port of the second acceleration application (in other words, connect the port of the top module to the port of the first acceleration application and the port of the second acceleration application) in the statement used to invoke the first acceleration application and the statement used to invoke the second acceleration application. In this way, after the first combined application is burnt to the FPGA chip, the port of the hardware circuit corresponding to the top module is also connected to a port of the hardware circuit corresponding to the first acceleration application and a port of the hardware circuit corresponding to the second acceleration application, so that the FPGA chip can use the hardware circuit corresponding to the top module to receive an input value from an external bus, transmit the input value to the hardware circuit corresponding to the first acceleration application and the hardware circuit corresponding to the second acceleration application for calculation, receive a calculation result returned by the hardware circuit corresponding to the first acceleration application and the hardware circuit corresponding to the second acceleration application, and return the calculation result to the external bus.

The top module may map one port to both the port of the first acceleration application and the port of the second acceleration application. For example, the top module includes a first port, and the first port is mapped to the port of the first acceleration application and the port of the second acceleration application. Alternatively, the top module may map different ports to the port of the first acceleration application and the port of the second acceleration application. For example, the top module includes a first port and a second port, the first port is mapped to the port of the first acceleration application, and the second port is mapped to the port of the second acceleration application. Through the foregoing mapping, the port of the top module may be connected to the port of the first acceleration application and the port of the second acceleration application to transmit a signal.

Figure 5:
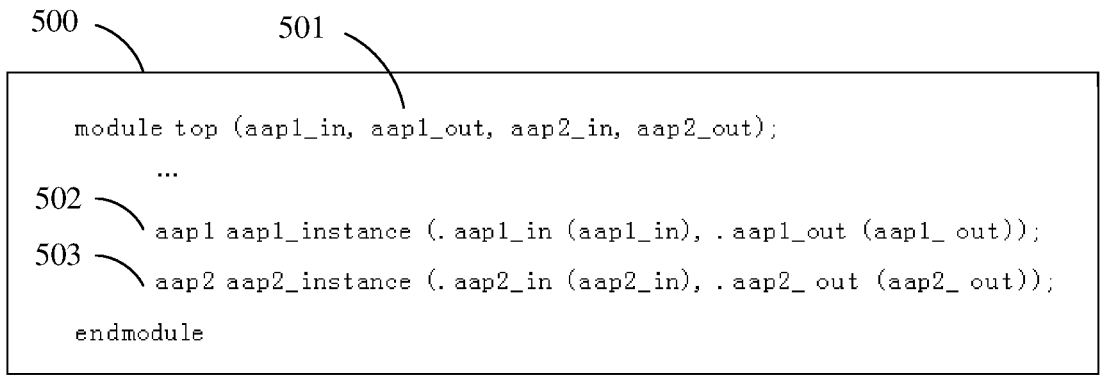
FIG. 5 shows an example of a top module described in a Verilog language according to an embodiment.

FIG. 5 shows an example of a top module in a Verilog language. A name of the top module 500 is "top", and a port list 501 of the top module 500 includes a port aap1_in, a port aap1_out, a port aap2_in, and a port aap2_out. The top module 500 includes a statement 502 for establishing an instance (whose name is aap1_instance) of an acceleration application aap1 and a statement 503 for establishing an instance (whose name is aap2_instance) of an acceleration application aap2. In the statement 502, ".aap1_in (aap1_in)" is used to establish a mapping from the port aap1_in of the top module 500 to a port aap1_in of the acceleration application aap1, and ".aap1_out (aap1_out)" is used to establish a mapping from the port aap1_out of the top module 500 to a port aap1_out of the acceleration application aap1. In the statement 503, ".aap2_in (aap2_in)" is used to establish a mapping from the port aap2_in of the top module 500 to a port aap2_in of the acceleration application aap2, and ".aap2_out (aap2_out)" is used to establish a mapping from the port aap2_out of the top module 500 to a port aap2_out of the acceleration application aap2.

The top module may also establish, in the statement for establishing the instance of the first acceleration application and the statement for establishing the instance of the second acceleration application, a mapping from a specified port of a middle module to a specified port of the first acceleration application and a specified port of the second acceleration application, and establish, in a statement for establishing an instance of the middle module, a mapping from a specified port of the top module to the specified port of the middle module and a mapping from the specified port of the first acceleration application and the specified port of the second acceleration application to the specified port of the middle module. In this way, the specified port of the top module communicates with the specified port of the first acceleration application and the specified port of the second acceleration application by using the middle module. The middle module may perform scheduling and management on signal transmission between the top module and each of the first acceleration application and the second acceleration application. For example, the middle module arbitrates a first signal sent by the top module to the first acceleration application and a second signal sent by the top module to the second acceleration application, to determine whether to preferentially send the first signal or the second signal.

Figure 6:
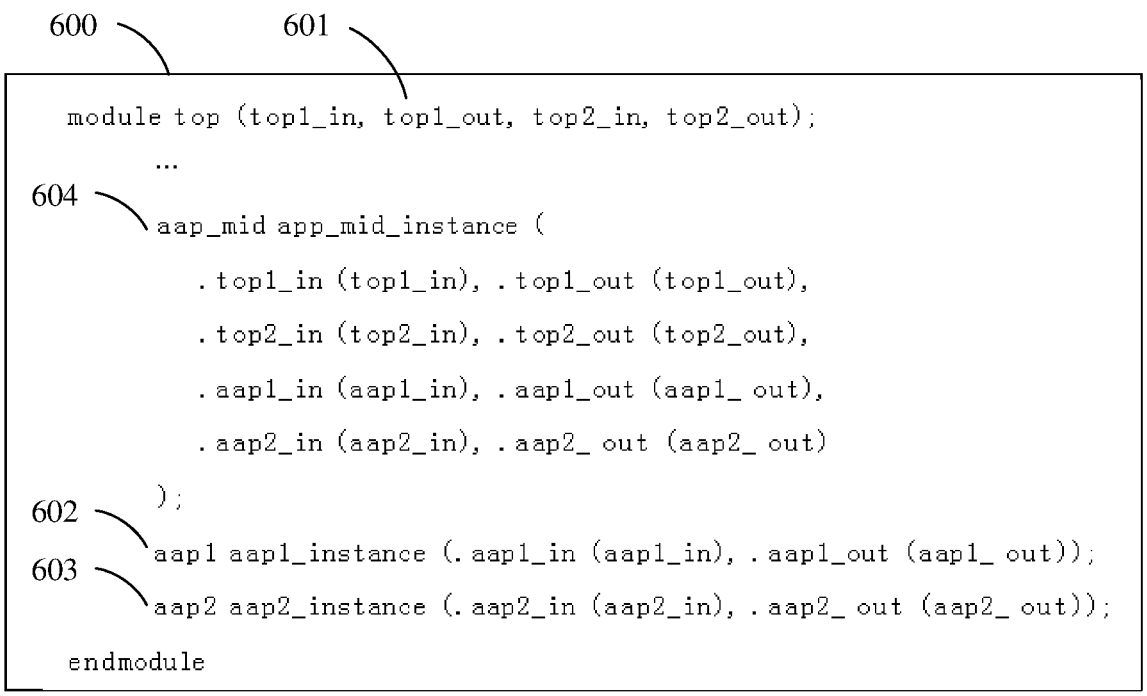
FIG. 6 shows another example of a top module described in a Verilog language according to an embodiment.

FIG. 6 shows another example of a top module in a Verilog language. A name of the top module 600 is "top", and a port list 601 of the top module 600 includes a port top1_in, a port top1_out, a port top2_in, and a port top2_out. The top module 600 includes a statement 602 for establishing an instance (whose name is aap1_instance) of an acceleration application aap1, a statement 603 for establishing an instance (whose name is aap2_instance) of an acceleration application aap2, and a statement 604 for establishing an instance (whose name is aap_mid_instance) of a middle module aap_mid.

In the statement 604, ".top1_in (top1_in)" is used to establish a mapping from the port top1_in of the top module to a port top1_in of the middle module aap_mid, ".top1_out (top1_out)" is used to establish a mapping from the port top1_out of the top module to a port top1_out of the middle module aap_mid, ".top2_in (top2_in)" is used to establish a mapping from the port top2_in of the top module to a port top2_in of the middle module aap_mid, and ".top2_out (top2_out)" is used to establish a mapping from the port top2_out of the top module to a port top2_out of the middle module aap_mid.

In the statement 604, ".aap1_in (aap1_in)" is used to establish a mapping from a port aap1_in of the acceleration application aap1 to a port aap1_in of the middle module aap_mid, ".aap1_out (aap1_out)" is used to establish a mapping from a port aap1_out of the acceleration application aap1 to a port aap1_out of the middle module aap_mid, ".aap2_in (aap2_in)" is used to establish a mapping from a port aap2_in of the acceleration application aap2 to a port aap2_in of the middle module aap_mid, and ".aap2_out (aap2_out)" is used to establish a mapping from a port aap2_out of the acceleration application aap2 to a port aap2_out of the middle module aap_mid.

In the statement 602, ".aap1_in (aap1_in)" is used to establish a mapping from the port aap1_in of the middle module aap_mid to the port aap1_in of the acceleration application aap1, and ".aap1_out (aap1_out)" is used to establish a mapping from the port aap1_out of the middle module aap_mid to the port aap1_out of the acceleration application aap1. In the statement 603, ".aap2_in (aap2_in)" is used to establish a mapping from the port aap2_in of the middle module aap_mid to the port aap2_in of the acceleration application aap2, and ".aap2_out (aap2_out)" is used to establish a mapping from the port aap2_out of the middle module aap_mid to the port aap2_out of the acceleration application aap2.

FIG. 5 and FIG. 6 show examples in which the top module is mapped to the port of the first acceleration application and the port of the second acceleration application by using different ports. Similarly, the top module may be alternatively mapped to the port of the first acceleration application and the port of the second acceleration application by using a same port, and details are not described herein.

FIG. 7A to FIG. 7F are schematic diagrams in which a mapping relationship is established between a port of a top module in a first combined application and each of a port of a first acceleration application and a port of a second acceleration application according to an embodiment. In FIG. 7A to FIG. 7F, that the first acceleration application 701 includes two ports and the second acceleration application 702 includes two ports is used as an example. In an FPGA chip, two ports of a hardware circuit corresponding to the first acceleration application 701 and two ports of a hardware circuit corresponding to the second acceleration application 702 may be connected by using an internal bus 711 of the FPGA, and a dashed line arrow shows a mapping relationship between ports.

Figure 7A:
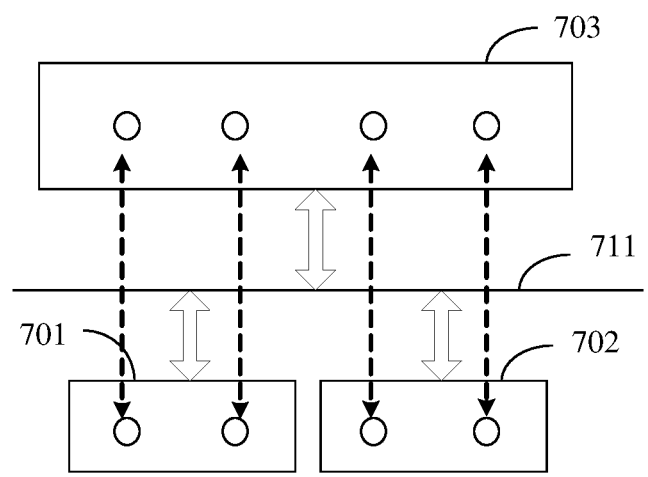
FIGS. 7A-7F are schematic diagrams in which a mapping relationship is established between a port of a top module in a first combined application and each of a port of a first acceleration application and a port of a second acceleration application according to an embodiment.

In an example, as shown in FIG. 7A, different ports of the top module 703 are mapped to the ports of the first acceleration application 701 and the ports of the second acceleration application 702. Input values received by the different ports of the top module 703 may be respectively transmitted to the ports of the first acceleration application 701 and the ports of the second acceleration application 702, and output values sent by the first acceleration application 701 and the second acceleration application 702 are respectively transmitted to the different ports of the top module 703.

Figure 7B:
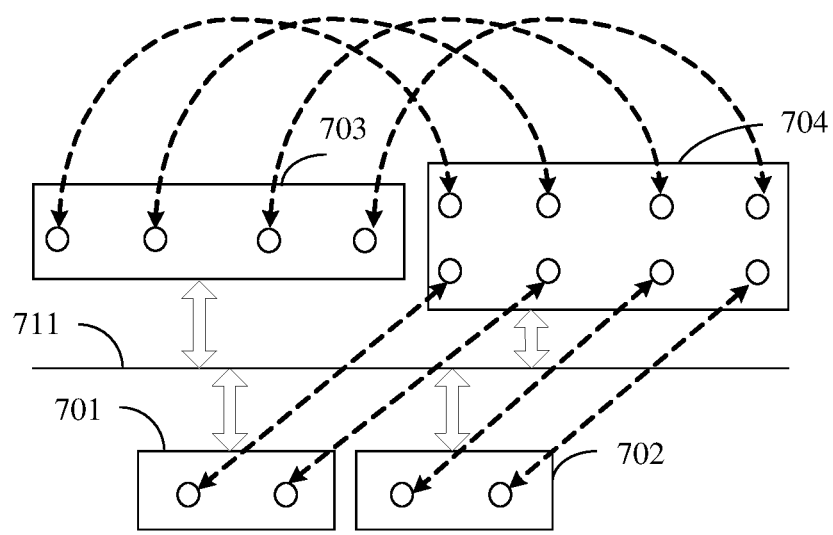

In another example, as shown in FIG. 7B, different ports of the top module 703 are mapped to different ports of a middle module 704, and different ports of the middle module 704 are mapped to the ports of the first acceleration application 701 and the ports of the second acceleration application 702.

Figure 7C:
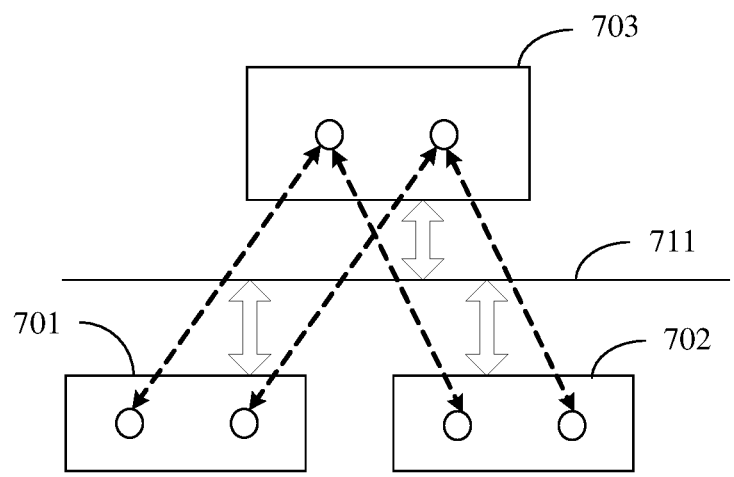

In another example, as shown in FIG. 7C, a same port of the top module 703 is mapped to a port of the first acceleration application 701 and a port of the second acceleration application 702. An input value received by the port of the top module 703 may be transmitted to both the port of the first acceleration application 701 and the port of the second acceleration application 702. The first acceleration application 701 and the second acceleration application 702 may determine, based on the input value, whether the input value is sent to the first acceleration application 701 and the second acceleration application 702. If the input value is sent to the first acceleration application 701 and the second acceleration application 702, the first acceleration application 701 and the second acceleration application 702 may receive the input value, perform calculation based on the input value, and send a calculation result to the port of the top module 703. In this case, a logical function of the first acceleration application 701 is related to a logical function of the second acceleration application 702, and the first acceleration application 701 and the second acceleration application 702 follow a same port standard. For example, the first acceleration application 701 is used for Advanced Encryption Standard (AES) encryption, the second acceleration application 702 is used for Data Encryption Standard (DES) encryption, and the first acceleration application 701 and the second acceleration application 702 may use a same input/output port. This port mapping manner facilitates compatibility with an original port connection relationship when a new acceleration application is added.

Figure 7D:
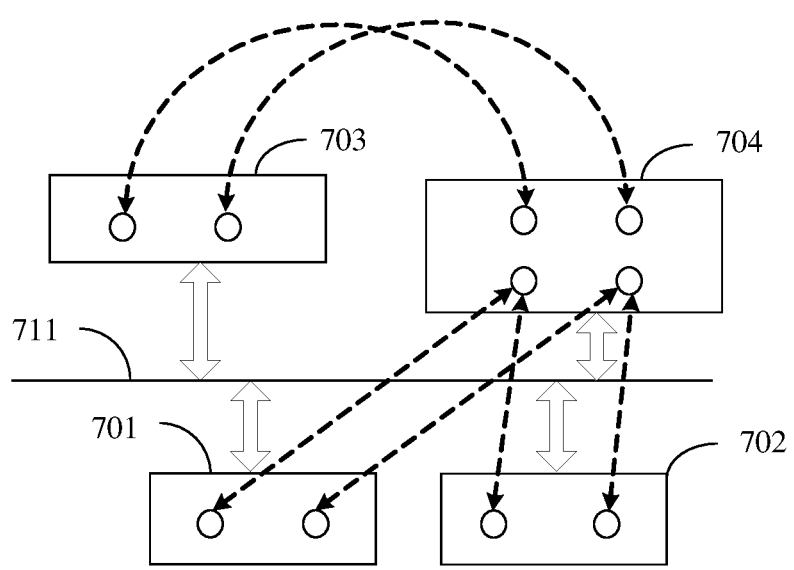

In another example, as shown in FIG. 7D, a port of the top module 703 is mapped to a port of a middle module 704, and a same port of the middle module 704 is mapped to a port of the first acceleration application 701 and a port of the second acceleration application 702. An input value received by the port of the top module 703 may be transmitted to both the port of the first acceleration application 701 and the port of the second acceleration application 702 through the port of the middle module 704. For processing on the input value by the first acceleration application 701 and the second acceleration application 702, refer to the description in the example in FIG. 7C. Details are not described herein again.

Figure 7E:
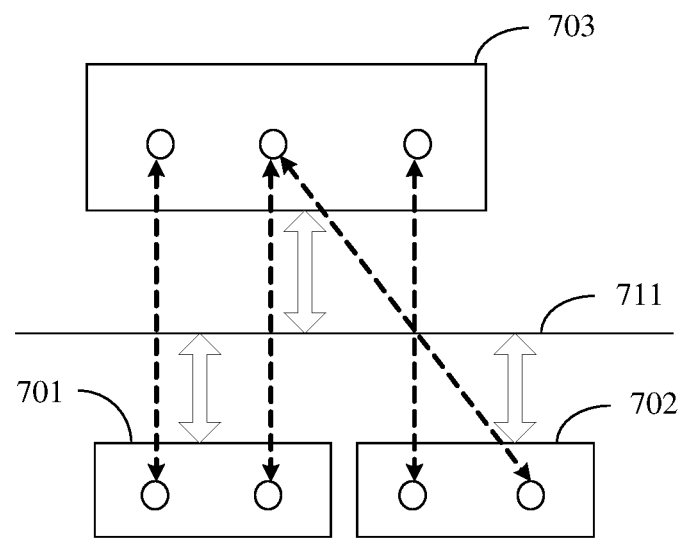

In another example, as shown in FIG. 7E, two ports of the top module 703 are respectively mapped to one port of the first acceleration application 701 and one port of the second acceleration application 702, and one port of the top module 703 is mapped to both one port of the first acceleration application 701 and one port of the second acceleration application 702. For processing on an input value by the first acceleration application 701 and the second acceleration application 702, refer to the description in the examples in FIG. 7A to FIG. 7D. Details are not described herein again.

Figure 7F:
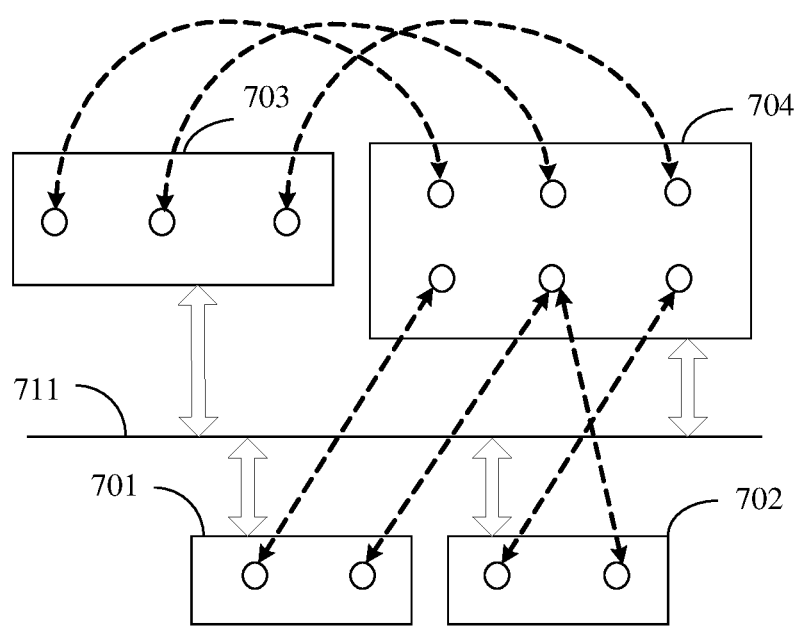

In another example, some same ports of the top module are mapped to a port of the first acceleration application and a port of the second acceleration application by using a middle module, and some different ports are mapped to a port of the first acceleration application and a port of the second acceleration application by using the middle module. As shown in FIG. 7F, three ports of the top module 703 are mapped to three ports of the middle module 704, other two ports of the middle module 704 are respectively mapped to one port of the first acceleration application 701 and one port of the second acceleration application 702, and the other port of the middle module 704 is mapped to both one port of the first acceleration application 701 and one port of the second acceleration application 702. For processing on an input value by the first acceleration application 701 and the second acceleration application 702, refer to the description in the examples in FIG. 7A to FIG. 7E. Details are not described herein again.

Likewise, the acceleration processing device 200 may combine three or more acceleration applications to obtain a combined application. For example, the top module may be mapped to a port of a first acceleration application, a port of a second acceleration application, and a port of a third acceleration application by using a same port, or may be mapped to a port of a first acceleration application, a port of a second acceleration application, and a port of a third acceleration application by using different ports, or may be mapped to a port of a first acceleration application, a port of a second acceleration application, and a port of a third acceleration application by using some same ports, and be mapped to a port of the first acceleration application, a port of the second acceleration application, and a port of the third acceleration application by using some different ports. For a manner of combining three or more acceleration applications to obtain a combined application, refer to the foregoing manner of combining two acceleration applications to obtain a combined application. Details are not described herein.

S402. The acceleration processing device burns the first combined application to a first acceleration resource.

An acceleration resource is an area in the FPGA chip (when the FPGA chip includes a plurality of areas) or the entire FPGA chip (when no area division is performed in the FPGA chip). The FPGA chip may be the FPGA chip in FIG. 2 or FIG. 3, for example, the FPGA 203, the FPGA 204, the FPGA 305, the FPGA 308, or the FPGA 309. The first acceleration resource may be one of the foregoing FPGA chips, or an area in one of the foregoing FPGA chips. For a burning process in which the acceleration processing device 200 burns the first combined application to the first acceleration resource, refer to the burning process in which the HDL code is burnt to the FPGA chip in FIG. 2 or FIG. 3. Details are not described herein.

In the acceleration processing method 400 in which the first acceleration application and the second acceleration application are combined to obtain the first combined application, and the first combined application is burnt to the first acceleration resource, acceleration resource utilization can be improved relative to a manner in which one acceleration application is burnt to one acceleration resource.

In the acceleration processing method 400, after the acceleration processing device 200 burns the first combined application to the first acceleration resource, the first acceleration resource may be used to execute the first acceleration application and the second acceleration application. In the NFV system architecture shown in FIG. 1, the NFVI provides an acceleration service for the virtualized network functions VNF 101, VNF 102, and VNF 103 by providing an API. Any one of the VNF 101, the VNF 102, and the VNF 103 may be implemented by the processor 201 by executing a computer program instruction in the memory 202 in the acceleration processing device 200, or may be implemented by another device in a network. The VNF 101 may send invocation requests with names or parameters of different APIs to invoke acceleration applications with different acceleration capabilities. The following provides an example in which the VNF 101 needs to use an acceleration service, and sends an invocation request for the first acceleration application to the NFVI, and the NFVI responds to the request by using an FPGA chip to which the first combined application is burnt.

In an example, the VNF 101 is implemented by the processor 201 by executing a computer program instruction.

A manner in which the acceleration processing device 200 obtains the invocation request is as follows: The processor 201 executes a computer program instruction to implement the NFVI to receive the invocation request sent by the VNF 101. After the acceleration processing device 200 obtains the invocation request, the processor 201 sends a trigger instruction to the first acceleration resource by using the bus in FIG. 2, and the trigger instruction is transmitted to a pin of the first acceleration resource. When the first acceleration resource is an FPGA chip, the pin of the first acceleration resource is a pin of the FPGA chip. When the first acceleration resource is an area in the FPGA chip, the pin of the first acceleration resource is a pin used for the area in the FPGA chip. The trigger instruction may include one or more input values, and may be used to trigger the first acceleration resource to execute the first acceleration application. A specified port of the top module of the first combined application burnt to the first acceleration resource may be mapped to a specified pin of the first acceleration resource, and the input value in the trigger instruction transmitted to the specified pin of the first acceleration resource is transmitted to the specified port of the top module. In response to the trigger instruction, the first acceleration resource may execute the first acceleration application to perform calculation based on the input value in the trigger instruction, and send a calculation result to the acceleration processing device 200.

In another example, the VNF 101 is implemented by another device in the network. A manner in which the acceleration processing device 200 obtains the invocation request is as follows: The processor 201 executes a computer program instruction to implement an NFVI function, receives, through the network interface 207 shown in FIG. 3, the invocation request sent by another device, and sends a trigger instruction to the acceleration device 301 or the acceleration device 302 through the network interface 207. The acceleration device 301 receives the trigger instruction through the network interface 303 under the control of the processor 304, and transmits the trigger instruction to a pin of the first acceleration resource by using an internal bus of the acceleration device 301. Alternatively, the acceleration device 302 receives the trigger instruction through the network interface 306 under the control of the processor 307, and transmits the trigger instruction to a pin of the first acceleration resource by using an internal bus of the acceleration device 302. In response to the trigger instruction, the first acceleration resource may execute the first acceleration application to perform calculation based on an input value in the trigger instruction, and send a calculation result to the acceleration processing device 200.

A processing manner in which the VNF 101 sends an invocation request for the second acceleration application to the NFVI is similar to the processing manner in which the VNF 101 sends the invocation request for the first acceleration application to the NFVI, and details are not described herein.

In the acceleration processing method 400, before combining the acceleration applications, the acceleration processing device 200 may obtain the acceleration applications in one or more of the following manners: obtaining the acceleration applications from a local memory, converting code of a language other than an HDL to generate the acceleration applications, receiving the acceleration applications from another device, and receiving code of a language other than an HDL from another device and converting the code to generate the acceleration applications.

In the acceleration processing method 400, the acceleration applications obtained by the acceleration processing device 200 from the local memory may be acceleration applications previously obtained by the acceleration processing device 200 and stored in the memory 202. When the second acceleration application is an acceleration application that is previously obtained and stored in the memory 202, the second acceleration application may be an acceleration application that has been burnt to a second acceleration resource. The second acceleration resource may be an area in an FPGA chip or an entire FPGA chip. After obtaining the second acceleration application, the acceleration processing device 200 stores the second acceleration application in the memory 202, and burns the second acceleration application to the second acceleration resource. The second acceleration resource is the area in the FPGA chip (when the FPGA chip includes a plurality of areas) or the FPGA chip (when no area division is performed in the FPGA chip).

Figure 8:
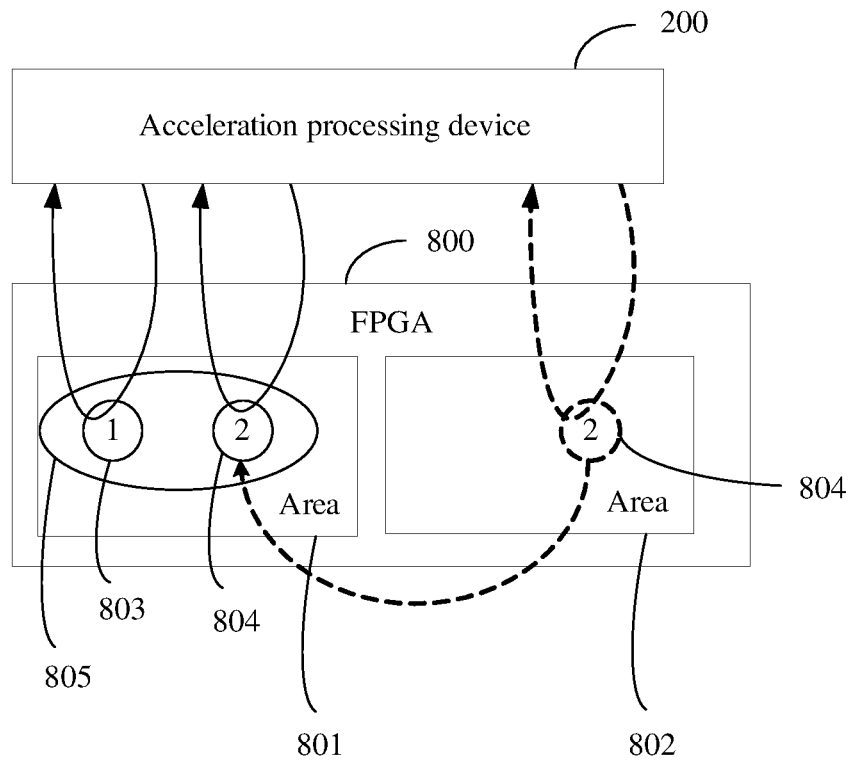
FIG. 8 shows an example of acceleration application migration between areas in an FPGA according to an embodiment.

In an example, an acceleration application may be migrated between areas in an FPGA. As shown in FIG. 8, an FPGA 800 includes an area 801 and an area 802. The area 801 is a first acceleration resource, and the area 802 is a second acceleration resource. Before a first combined application 805 is burnt to the area 801, a second acceleration application 804 is burnt to the area 802. The acceleration processing device 200 may send a trigger instruction including an input value to the area 802, and obtain a returned calculation result. After the acceleration processing device 200 combines the second acceleration application 804 and a first acceleration application 803 to obtain the first combined application 805, and burns the first combined application 805 to the area 801, if the acceleration processing device 200 receives an invocation request for the second acceleration application, the acceleration processing device 200 sends a trigger instruction to only the area 801 to trigger the area 801, namely, the first acceleration resource, to execute the second acceleration application, and no longer sends a trigger instruction to the area 802. In this way, the second acceleration application 804 is migrated from the area 802 to the area 801.

Figure 9:
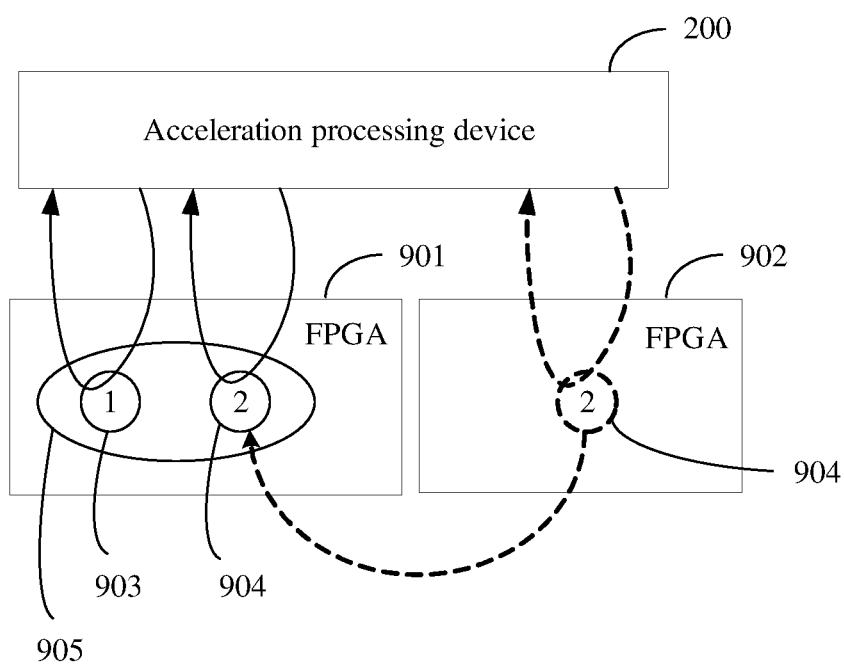
FIG. 9 shows an example of acceleration application migration between FPGAs according to an embodiment.

In another example, an acceleration application may be migrated between FPGAs. As shown in FIG. 9, an FPGA 901 is a first acceleration resource, and an FPGA 902 is a second acceleration resource. Before a first combined application 905 is burnt to the FPGA 901, a second acceleration application 904 is burnt to the FPGA 902 by the acceleration processing device 200 or another device. The acceleration processing device 200 may send a trigger instruction including an input value to the FPGA 902, and obtain a returned calculation result. After the acceleration processing device 200 combines the second acceleration application 904 and a first acceleration application 903 to obtain the first combined application 905, and burns the first combined application 905 to the FPGA 901, if the acceleration processing device 200 receives an invocation request for the second acceleration application, the acceleration processing device 200 sends a trigger instruction to only the FPGA 901 to trigger the FPGA 901, namely, the first acceleration resource, to execute the second acceleration application, and no longer sends a trigger instruction to the FPGA 902. In this way, the second acceleration application 904 is migrated from the FPGA 902 to the FPGA 901. When combining the acceleration applications, the acceleration processing device 200 migrates an acceleration application that has been burnt to an acceleration resource to a new acceleration resource. In the new acceleration resource, the acceleration application is combined with another acceleration application. This helps achieve higher utilization of an existing acceleration resource. In an NFV system, this helps meet more requirements with fewer FPGAs.

In the acceleration processing method 400, before the acceleration processing device 200 burns the first combined application to the first acceleration resource, the second acceleration application may be an acceleration application that has been burnt by the acceleration processing device 200 or another device to the first acceleration resource. In the acceleration processing method 400, in a process in which the first combined application is burnt to the first acceleration resource, when there is an invocation request for the second acceleration application, the acceleration processing device 200 may replace the first acceleration resource to execute the second acceleration application. After the burning ends, original content burnt to the first acceleration resource is replaced (namely, reconfigured) with the first combined application, so that the first acceleration resource may execute both an invocation request for the first acceleration application and the invocation request for the second acceleration application. In this case, the first acceleration resource may be restored to execute the invocation request for the second acceleration application. The acceleration processing device 200 may execute, by using the processor 201, a computer program instruction stored in the memory 202, to convert the second acceleration application into a computer program instruction that can be executed by the processor 201, so as to execute the second acceleration application. In this way, an invocation request for an acceleration application in the burning process can be responded in a timely manner in the acceleration processing method 400.

In the acceleration processing method 400, when there are a plurality of acceleration resources that can be used for burning, selection may be performed based on utilization of using an acceleration resource by a combined application. This helps improve acceleration resource utilization. For example, when there is the first acceleration resource and a third acceleration resource, if it is determined that utilization of using the first acceleration resource by the first combined application is higher than utilization of using the third acceleration resource by the first combined application, the first combined application is burnt to the first acceleration resource.

Figures 10, 11:
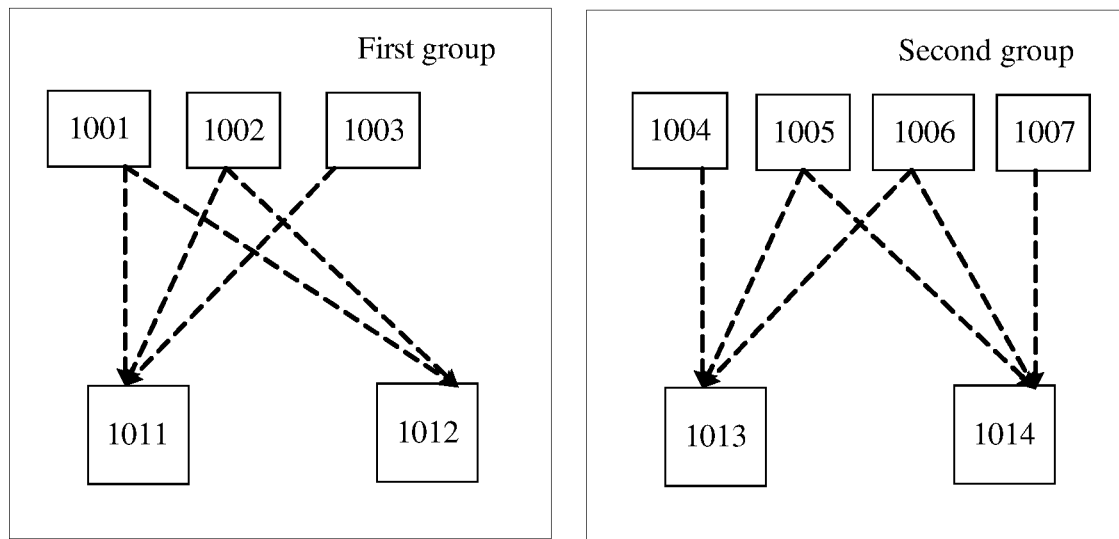
FIG. 10 shows an example of utilization of using various types of hardware resources in an acceleration resource by a combined application according to an embodiment.
FIG. 11 shows an example of establishing a group based on matching between an acceleration resource and an acceleration application according to an embodiment.

The acceleration resource (namely, an FPGA or an area in an FPGA) may include a plurality of types of hardware resources, such as a register, a lookup table (LUT), a RAM, and an input/output port. FIG. 10 shows an example of utilization of using various types of hardware resources in an acceleration resource by a combined application. As shown in FIG. 10, after being burnt to the acceleration resource, the combined application uses 13.89% registers, 60.98% LUTs, 75.56% RAMs, and 12% input/output ports. Utilization of using the acceleration resource by the combined application may be determined based on the utilization of using the various types of hardware resources in the acceleration resource by the combined application. For example, the utilization of using the acceleration resource by the combined application may be utilization of using the LUTs in the acceleration resource by the combined application. When utilization of using LUTs in the first acceleration resource by the combined application is higher than utilization of using LUTs in the second acceleration resource by the combined application, it is determined that utilization of using the first acceleration resource by the combined application is higher than utilization of using the second acceleration resource by the combined application. For example, the utilization of using the acceleration resource by the combined application may be a sum of utilization of using the LUTs in the acceleration resource by the combined application and utilization of using the RAMs in the acceleration resource by the combined application. When a sum of utilization of using LUTs in the first acceleration resource by the combined application and utilization of using RAMs in the first acceleration resource by the combined application is greater than a sum of utilization of using LUTs in the second acceleration resource by the combined application and utilization of using RAMs in the second acceleration resource by the combined application, it is determined that utilization of using the first acceleration resource by the combined application is higher than utilization of using the second acceleration resource by the combined application. For another example, the utilization of using the acceleration resource by the combined application may be calculated by using the following formula:

$$U = \sum_{i=1}^{n} \frac{A_i}{B_i} \times x_i$$

U is the utilization of using the acceleration resource by the combined application, n is a quantity of types of hardware resources in the acceleration resource, $A_i$ is a quantity of an $i^{th}$ type of hardware resource that is in the acceleration resource and that is used by the combined application, $B_i$ is a total quantity of the $i^{th}$ type of hardware resource in the acceleration resource, and $x_i$ is a weight coefficient of the $i^{th}$ type of hardware resource in the acceleration resource. $A_i/B_i$ is utilization of using the $i^{th}$ type of hardware resource in the acceleration resource by the combined application.

The foregoing formula may be also used to calculate utilization of using an acceleration resource by one acceleration application (when only one acceleration application is burnt to an acceleration resource). In this case, U is the utilization of using the acceleration resource by the acceleration application, n is a quantity of types of hardware resources in the acceleration resource, $A_i$ is a quantity of an $i^{th}$ type of hardware resource that is in the acceleration resource and that is used by the acceleration application, $B_i$ is a total quantity of the $i^{th}$ type of hardware resource in the acceleration resource, and $x_i$ is a weight coefficient of the $i^{th}$ type of hardware resource in the acceleration resource. $A_i/B_i$ is utilization of using the $i^{th}$ type of hardware resource in the acceleration resource by the acceleration application.

In the acceleration processing method 400, when the acceleration resource is an area in an FPGA chip, because the FPGA chip using a PR technology includes some common hardware resources shared by all areas, in this case, utilization of each type of hardware resource may be obtained by dividing an actual use quantity of the type of hardware resource by an actual total quantity of the type of hardware resource. The actual use quantity includes a use quantity of the type of hardware resource in the acceleration resource and a quantity of the type of hardware resource in the common hardware resources. The actual total quantity includes a total quantity of the type of hardware resource in the acceleration resource and a total quantity of the type of hardware resource in the common hardware resources. In this way, utilization can be calculated more accurately.

In the acceleration processing method 400, the acceleration processing device 200 may execute a computer program instruction to implement a function of the NFVI in the NFV system shown in FIG. 1. The function of the NFVI may include acceleration resource discovery (for example, discovering a new FPGA chip), acceleration resource registration (for example, recording information about a newly discovered FPGA chip), acceleration resource status collection (for example, recording use information of an FPGA chip, so as to learn which FPGA or which area of an FPGA is in use, and which FPGA or which area of an FPGA is in an idle state), and acceleration resource configuration (for example, FPGA chip burning). The function of the NFVI may include a combined application management function, used to perform the acceleration processing method 400. The combined application management function may be completed by an independent component in the NFVI or may be cooperatively completed by a plurality of components. For example, when the combined application management function is cooperatively completed by the plurality of components, a combination component may combine the first acceleration application and the second acceleration application to obtain the first combined application, and invoke a configuration component configured to execute an acceleration resource configuration function, to burn the first combined application to an FPGA chip or an area in an FPGA chip. The foregoing functions of the NFVI may be set in an NFVI in an existing NFV system. This facilitates joint deployment with another NFV system. Adding a function of performing the acceleration processing method 400 to the NFVI in the existing NFV system can extend a function of the existing NFV system, for example, add the combined application management function to the NFV system. In the acceleration processing method 400, the acceleration processing device 200 may obtain information about all acceleration resources in the NFV system, and the information may include use information recording whether an acceleration resource is used. The information about the acceleration resources may be obtained by the NFVI.

In an example, after obtaining one or more new acceleration applications (namely, acceleration applications that are not stored in the memory 202), the acceleration processing device 200 may first determine whether an unused acceleration resource in the NFV system is sufficient to burn the one or more new acceleration applications. If the unused acceleration resource in the NFV system is sufficient to burn the one or more new acceleration applications, an acceleration application that has been burnt to an acceleration resource may be excluded when acceleration applications are combined. If the unused acceleration resource in the NFV system is not sufficient to burn the one or more new acceleration applications, an acceleration application that has been burnt to an acceleration resource may be included when acceleration applications are combined, to recombine the burnt acceleration application and the new acceleration application through acceleration application migration, so as to implement acceleration application burning based on recombination.

After migrating an acceleration application to a new acceleration resource, the acceleration processing device 200 may update the information about the acceleration resources that is stored in the NFV system. The update may be completed by the NFVI. For example, as shown in FIG. 8, after the second acceleration application 804 is migrated from the area 802 to the area 801, use information of the area 801 is updated as "used", and use information of the area 802 is updated as "unused". For example, as shown in FIG. 9, after the second acceleration application 904 is migrated from the FPGA 902 to the FPGA 901, the FPGA 901 is updated as "used", and the FPGA 902 is updated as "unused". In this way, the acceleration resource updated as "unused" may be reused to burn an acceleration application or a combined application obtained by combining acceleration applications.

Combination and burning of acceleration applications and migration of an acceleration application in the NFV system are transparent to a VNF. In this way, acceleration resource utilization can be improved while the VNF is unaware.

In the acceleration processing method 400, after obtaining a plurality of acceleration applications, the acceleration processing device 200 may randomly combine the plurality of acceleration applications to obtain one or more combined applications, and determine an allocation scheme based on utilization of using an acceleration resource by the combined application, utilization of using an acceleration resource by the acceleration applications, and/or a quantity of acceleration resources in use. The allocation scheme is a correspondence between a plurality of acceleration resources and the plurality of acceleration applications obtained by the acceleration processing device 200. In the allocation scheme, each of the plurality of acceleration applications corresponds to one acceleration resource, and one acceleration resource may correspond to no acceleration application, or correspond to one acceleration application, or correspond to a plurality of acceleration applications. The acceleration processing device may perform burning according to the allocation scheme. When one acceleration resource corresponds to a plurality of acceleration applications, a combined application obtained by combining the plurality of acceleration applications may be burnt to the acceleration resource. When one acceleration resource corresponds to one acceleration application, the acceleration application may be burnt to the acceleration resource. The acceleration processing device 200 may determine a plurality of allocation schemes, select an allocation scheme (namely, a preferential allocation scheme) from the plurality of allocation schemes according to different selection policies, and perform burning according to the preferential allocation scheme.

Before combining the plurality of acceleration applications, the acceleration processing device 200 may obtain information about all acceleration resources, all idle acceleration resources (namely, unused acceleration resources), or all available acceleration resources in the NFV system, and match each acceleration resource with each acceleration application, to determine which acceleration resource can meet a requirement of which acceleration application (in other words, which acceleration resource can match which acceleration application). A matching condition may include whether a port rate, a port quantity, a RAM quantity, and an LUT quantity are sufficient, and the like. The acceleration processing device 200 may perform acceleration application combination and utilization calculation based on the foregoing matching, to reduce a calculation amount.

The acceleration processing device 200 may establish a group based on the foregoing matching, so that an acceleration application in each group can match an acceleration resource in only the group, thereby reducing a calculation amount. For example, as shown in FIG. 11, in an example of establishing a group based on matching between an acceleration resource and an acceleration application, a first group includes an acceleration resource 1011, an acceleration resource 1012, an acceleration application 1001, an acceleration application 1002, and an acceleration application 1003. The acceleration application 1001 and the acceleration application 1002 in the first group may match the acceleration resource 1011 and the acceleration resource 1012, and the acceleration application 1003 can match only the acceleration resource 1011, and cannot match the acceleration resource 1012. A second group includes an acceleration resource 1013, an acceleration resource 1014, an acceleration application 1004, an acceleration application 1005, an acceleration application 1006, and an acceleration application 1007. The acceleration application 1004, the acceleration application 1005, and the acceleration application 1006 in the second group may match the acceleration resource 1013, and the acceleration application 1005, the acceleration application 1006, and the acceleration application 1007 may match the acceleration resource 1014. The acceleration processing device 200 may perform acceleration application combination and utilization calculation in each group, to reduce a calculation amount. The following provides description by using an example in which the acceleration processing device 200 separately performs utilization calculation in the first group and the second group and determines an allocation scheme. Certainly, the acceleration processing device 200 may not perform grouping, and perform calculation based on all acceleration resources and all acceleration applications.

When determining the allocation scheme, the acceleration processing device 200 may randomly combine a plurality of obtained acceleration applications, and specify a correspondence between the plurality of acceleration applications and each acceleration resource. To improve processing efficiency, after an allocation scheme in which an acceleration resource cannot be matched (for example, in the allocation scheme, a plurality of acceleration applications correspond to an acceleration resource a, but a combined application obtained after the plurality of acceleration applications are combined cannot match the acceleration resource a; or for another example, in the allocation scheme, an acceleration application b corresponds to an acceleration resource c, but the acceleration application b cannot match the acceleration resource c) is removed, a preferential allocation scheme may be selected from remaining allocation schemes.

The acceleration processing device 200 may set different selection policies to select a preferential allocation scheme from a plurality of allocation schemes. The following provides several examples.

(1) The preferential allocation scheme may be an allocation scheme in which a quantity of used acceleration resources is smallest. The used acceleration resource is an acceleration resource corresponding to at least one acceleration application in the allocation scheme. Priorities in descending order that are of the plurality of allocation schemes may be determined based on a descending order of quantities of used acceleration resources. Allocation schemes in which quantities of used acceleration resources are the same may have a same priority. More acceleration resources can be saved by applying this selection policy, so as to meet a subsequent requirement for an acceleration resource.

(2) The preferential allocation scheme may be an allocation scheme in which a sum of utilization of used acceleration resources is largest. When one acceleration resource corresponds to a plurality of acceleration applications in the allocation scheme, utilization of the acceleration resource is utilization of using the acceleration resource by a combined application obtained after the plurality of acceleration applications are combined. When one acceleration resource corresponds to only one acceleration application in the allocation scheme, utilization of the acceleration resource is utilization of using the acceleration resource by the acceleration application. Priorities in descending order that are of the plurality of allocation schemes may be determined based on a descending order of sums of utilization of used acceleration resources. Allocation schemes in which sums of utilization of used acceleration resources are the same may have a same priority. Relatively high overall acceleration resource utilization can be achieved by applying this selection policy.

(3) The preferential allocation scheme may be an allocation scheme in which acceleration applications are most centralized. A manner of determining the allocation scheme in which acceleration applications are most centralized may be as follows: Utilization of all acceleration resources used in each allocation scheme forms a set, utilization with a smallest value is removed from the set, a sum of remaining utilization in the set is calculated, and an allocation scheme in which a sum of remaining utilization is largest is the allocation scheme in which acceleration applications are most centralized. Priorities in descending order that are of the plurality of allocation schemes may be determined based on a descending order of sums of remaining utilization. Allocation schemes in which sums of remaining utilization are the same may have a same priority. Through application of this selection policy, when a step of determining an allocation scheme in the acceleration processing method 400 is subsequently performed again, some acceleration resources (excluding an acceleration resource that has utilization with a smallest value when the allocation scheme is previously determined) that are previously used for burning may be excluded. Because the some acceleration resources that are previously used for burning have achieved relatively high utilization, when the some acceleration resources are excluded to determine the allocation scheme to reduce impact on the acceleration resources that have been used for burning or reduce a calculation amount, relatively high overall acceleration resource (including the some acceleration resources that are previously used for burning and an acceleration resource used for burning when the acceleration processing method 400 is performed again) utilization can still be achieved.

The foregoing manners of determining the priorities of the plurality of allocation schemes may be randomly combined, to select an allocation scheme with a highest priority as the preferential allocation scheme. For example, an allocation scheme in which a quantity of used acceleration resources is smallest has a highest priority. When quantities of acceleration resources used in two allocation schemes are the same, an allocation scheme in which a sum of utilization of used acceleration resources is larger has a higher priority. When sums of utilization of acceleration resources used in two allocation schemes are the same, an allocation scheme in which acceleration applications are more centralized (namely, an allocation scheme in which a sum of remaining utilization is larger after utilization with a smallest value is removed from each of the sums of the utilization of the acceleration resources used in the two allocation schemes, where for details, refer to the third example in which the order of the priorities of the plurality of allocation schemes is determined) has a higher priority.

Referring to a matching relationship shown in a first group in FIG. 11, the first group includes an acceleration application 1001, an acceleration application 1002, and an acceleration application 1003. The acceleration processing device 200 may combine any two or three of the acceleration applications to obtain a plurality of combined applications. When a combined application obtained by combining the acceleration application 1001, the acceleration application 1002, and the acceleration application 1003 can match an acceleration resource 1011, in this case, a quantity of used acceleration resources is 1, which is less than that in any other allocation scheme, and therefore this scheme is a preferential allocation scheme.

Figures 12, 13:
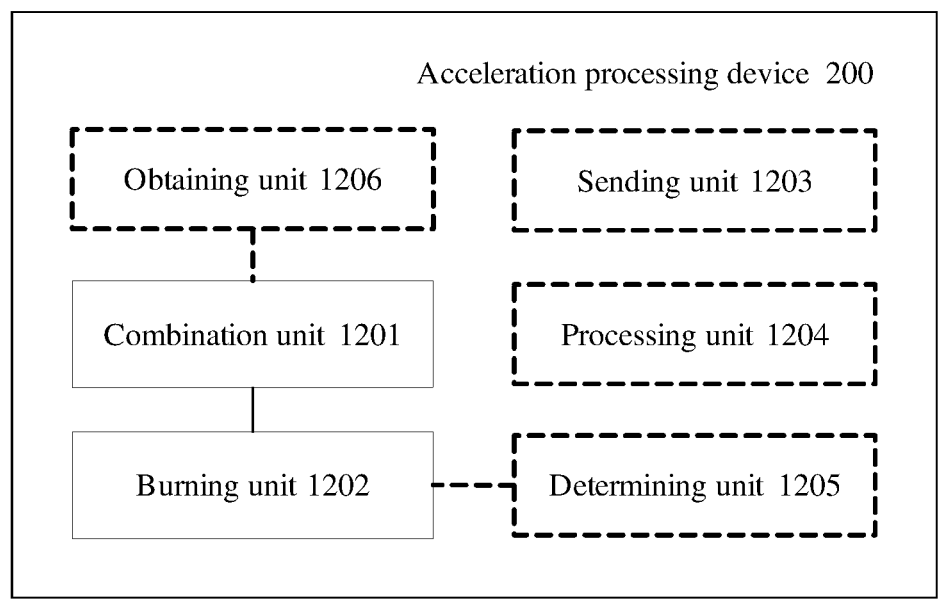
FIG. 12 shows an example of utilization of using an acceleration resource by a combined application and an acceleration application according to an embodiment.
FIG. 13 is a schematic diagram of an acceleration processing device 200 applied to a system shown in FIG. 1 according to an embodiment.

It is assumed that a combined application obtained by combining the acceleration application 1001, the acceleration application 1002, and the acceleration application 1003 cannot match an acceleration resource 1011 or an acceleration resource 1012, a combined application obtained by combining any two acceleration applications can match the acceleration resource 1011 and the acceleration resource 1012, and through calculation, utilization of using an acceleration resource by each acceleration application and the combined application obtained by combining any two acceleration applications is shown in FIG. 12. In FIG. 12, combined applications 1101, 1102, and 1103 are respectively obtained by combining the acceleration application 1001 and the acceleration application 1002, the acceleration application 1001 and the acceleration application 1003, and the acceleration application 1002 and the acceleration application 1003.

A sum of utilization (80%) of using the acceleration resource 1011 by the combined application 1101 and utilization (20%) of using the acceleration resource 1012 by the acceleration application 1003 is 100%. A sum of utilization (70%) of using the acceleration resource 1011 by the combined application 1102 and utilization (30%) of using the acceleration resource 1012 by the acceleration application 1002 is 100%. A sum of utilization (60%) of using the acceleration resource 1011 by the combined application 1103 and utilization (40%) of using the acceleration resource 1012 by the acceleration application 1001 is 100%. A sum of utilization (70%) of using the acceleration resource 1012 by the combined application 1101 and utilization (25%) of using the acceleration resource 1011 by the acceleration application 1003 is 95%. A sum of utilization (60%) of using the acceleration resource 1012 by the combined application 1102 and utilization (35%) of using the acceleration resource 1011 by the acceleration application 1002 is 95%. A sum of utilization (50%) of using the acceleration resource 1012 by the combined application 1103 and utilization (45%) of using the acceleration resource 1011 by the acceleration application 1001 is 95%. There are three allocation schemes (greater than the other three allocation schemes in which utilization is 95%) in which a sum of utilization is 100%. The three schemes in which the sum of utilization is 100% may have a same priority. When selecting a scheme, the acceleration processing device 200 may select any one of the allocation schemes with the same priority as the preferential allocation scheme.

Alternatively, the acceleration processing device 200 may remove smallest utilization, namely, the utilization 20% corresponding to the acceleration application 1003, the utilization 30% corresponding to the acceleration application 1002, and the utilization 40% corresponding to the acceleration application 1001, from each of utilization sets included in the three allocation schemes in which the sum of utilization is 100%, and then sums of remaining utilization are respectively 80%, 70%, and 60%. In this way, an allocation scheme that is in the three allocation schemes and in which a sum of remaining utilization is largest, namely, 80%, is the preferential allocation scheme (namely, an allocation scheme in which acceleration applications are most centralized). In the preferential allocation scheme, the combined application 1101 corresponds to the acceleration resource 1011, and the acceleration application 1003 corresponds to the acceleration resource 1012. When two acceleration resources are used in each of the three allocation schemes in which the sum of utilization is 100%, utilization of one acceleration resource in the preferential allocation scheme is highest, and utilization of the other acceleration resource is lowest. To be specific, in the preferential allocation scheme, acceleration applications are distributed in a more centralized manner on acceleration resources other than the acceleration resource with lowest utilization. After burning is performed according to the preferential allocation scheme, when acceleration applications are combined and an allocation scheme is determined again subsequently, the acceleration resource 1011 may be excluded when matching is performed on an acceleration resource. In this way, because the acceleration resource 1011 has relatively high utilization in previous burning, when the allocation scheme is determined again, even if the acceleration resource 1011 is excluded to reduce impact on an acceleration resource that has been used for burning or reduce a calculation amount, relatively high overall acceleration resource (including the acceleration resource 1011 and the acceleration resource 1012) utilization can still be achieved.

Referring to a matching relationship shown in a second group in FIG. 11, the second group includes an acceleration application 1004, an acceleration application 1005, an acceleration application 1006, and an acceleration application 1007. The acceleration processing device 200 may combine any two, three, or four of the acceleration applications to obtain a plurality of combined applications. It is assumed that a combined application obtained by combining any three or four acceleration applications cannot match an acceleration resource 1013 or an acceleration resource 1014, a combined application obtained by combining any two of the acceleration application 1004, the acceleration application 1005, and the acceleration application 1006 can match the acceleration resource 1013, and a combined application obtained by combining any two of the acceleration application 1005, the acceleration application 1006, and the acceleration application 1007 can match the acceleration resource 1014. The acceleration processing device 200 may calculate a sum of utilization for a combined application that is obtained after the foregoing combination and that can match any acceleration resource. For example, if it is determined that a sum of utilization of using the acceleration resource 1013 by a combined application obtained by combining the acceleration application 1004 and the acceleration application 1005 and utilization of using the acceleration resource 1014 by a combined application obtained by combining the acceleration application 1006 and the acceleration application 1007 is largest, it is determined that the preferential allocation scheme is that the combined application obtained by combining the acceleration application 1004 and the acceleration application 1005 corresponds to the acceleration resource 1013, and the combined application obtained by combining the acceleration application 1006 and the acceleration application 1007 corresponds to the acceleration resource 1014. Likewise, when there are a plurality of allocation schemes in which sums of utilization are the same, smallest utilization may be removed from each of the plurality of allocation schemes, priorities in descending order that are of the plurality of allocation schemes may be determined based on a descending order of sums of remaining utilization, and a scheme with a highest priority is selected as the preferential allocation scheme.

The acceleration processing device 200 may further select the plurality of allocation schemes one by one in descending order of the priorities, perform burning according to a selected allocation scheme, and select a next allocation scheme when burning cannot be completed according to the selected allocation scheme in the burning process (for example, in an emulation process, it is detected that an acceleration resource cannot meet a time sequence constraint or a hardware resource required by a combined application), until burning is completed. In the foregoing process, the acceleration processing device 200 may automatically select an allocation scheme with a highest priority from allocation schemes in which burning can be completed, to complete burning, so as to improve acceleration resource utilization.

FIG. 13 is a schematic diagram of an acceleration processing device 200 applied to a system shown in FIG. 1 according to an embodiment. The acceleration processing device 200 includes a combination unit 1201 and a burning unit 1202, and may be configured to perform the acceleration processing method 400.

The combination unit 1201 is configured to combine a first acceleration application and a second acceleration application to obtain a first combined application. For details, refer to description of S401 in the acceleration processing method 400. Details are not described herein again.

The burning unit 1202 is configured to burn the first combined application to a first acceleration resource. For details, refer to description of S402 in the acceleration processing method 400. Details are not described herein again.

The acceleration processing device 200 may further include a sending unit 1203. When the second acceleration application is an acceleration application that has been burnt to a second acceleration resource, after the burning unit 1202 burns the first combined application to the first acceleration resource, the sending unit 1203 sends, to the first acceleration resource, an instruction used to trigger the second acceleration application, but no longer sends, to the second acceleration resource, an instruction used to trigger the second acceleration application, so as to implement acceleration application migration. For details, refer to description of acceleration application migration between FPGAs or areas in an FPGA in the acceleration processing method 400.

The acceleration processing device 200 may further include a processing unit 1204. When the second acceleration application is an acceleration application that has been burnt to the first acceleration resource, in a process in which the burning unit 1202 burns the first combined application to the first acceleration resource, the processing unit 1204 executes the second acceleration application. For details, refer to description in which the acceleration processing device 200 replaces the first acceleration resource to execute the second acceleration application in the acceleration processing method 400.

The acceleration processing device 200 may further include a determining unit 1205, so that when there are a plurality of acceleration resources that can be used for burning, an acceleration resource to be used for burning can be selected based on utilization of using the acceleration resource by a combined application. For example, after the determining unit 1205 determines that utilization of using the first acceleration resource by the first combined application is higher than utilization of using a third acceleration resource by the first combined application, the burning unit 1202 burns the first combined application to the first acceleration resource. The third acceleration resource may be an area in an FPGA chip or an entire FPGA chip.

The acceleration processing device 200 further includes an obtaining unit 1206, so as to obtain a plurality of acceleration applications including the first acceleration application and the second acceleration application. For details, refer to description of an acceleration application obtaining manner in the acceleration processing method 400.

The burning unit 1202 may burn the first combined application to the first acceleration resource according to a preferential allocation scheme in a plurality of allocation schemes. Each of the plurality of allocation schemes is a correspondence between a plurality of acceleration resources and the plurality of acceleration applications. For details, refer to description of determining an allocation scheme in the acceleration processing method 400.

Some or all of the combination unit 1201, the burning unit 1202, the sending unit 1203, the processing unit 1204, the determining unit 1205, and the obtaining unit 1206 may be implemented by a computer program instruction, and the computer program instruction may be used to implement a function of the NFVI in the NFV system shown in FIG. 1. In this way, the NFV system can perform the acceleration processing method 400 by using the NFVI, so that acceleration resource utilization is improved.

All or some of the foregoing embodiments may be implemented by using software, hardware, firmware, or any combination thereof. When software is used to implement the embodiments, the embodiments may be implemented completely or partially in a form of a computer program product. The computer program product includes one or more computer program instructions. When the computer program instructions are loaded and executed on a computer, the procedure or functions according to the embodiments are all or partially generated. The computer may be a general-purpose computer, a dedicated computer, a computer network, or another programmable apparatus. The computer instructions may be stored in a computer-readable storage medium or may be transmitted from a computer-readable storage medium to another computer-readable storage medium. For example, the computer program instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a digital video disc (DVD)), a semiconductor medium (for example, an SSD), or the like.

The foregoing descriptions are merely specific implementations, but are not intended to limit the protection scope of this disclosure. Any variation or replacement readily figured out by a person skilled in the art within the technical scope disclosed in this disclosure shall fall within the protection scope of this disclosure. Therefore, the protection scope of this disclosure shall be subject to the protection scope of the claims.

What is claimed is:

1. An acceleration processing method implemented by an acceleration processing device, the acceleration processing method comprising:
    combining a first acceleration application and a second acceleration application to obtain a first combined application, wherein the first combined application comprises a top code, the first acceleration application, and the second acceleration application, and wherein the top code comprises a first statement for invoking the first acceleration application, a second statement for invoking the second acceleration application, and a port;
    burning the first combined application to an area in a first acceleration resource, wherein the first acceleration resource is a field-programmable gate array (FPGA) comprising a pin;
    mapping, alter burning the first combined application, the port to the pin;
    burning the second acceleration application to the first acceleration resource; and
    after burning the second acceleration application, executing the second acceleration application while simultaneously burning the first combined application to the first acceleration resource.

2. The acceleration processing method of claim 1, further comprising determining, before burning the combined application, that utilization of using the first acceleration resource by the first combined application is higher than utilization of using a third acceleration resource by the first combined application.

3. The acceleration processing method of claim 2, further comprising:
    obtaining, before combining the first acceleration application and the second acceleration application, acceleration applications comprising the first acceleration application and the second acceleration application.

4. The acceleration processing method of claim 3, further comprising further burning the first combined application to the first acceleration resource according to a preferential allocation scheme.

5. The acceleration processing method of claim 4, wherein the preferential allocation scheme comprises a correspondence between the first acceleration resource and each of the first acceleration application and the second acceleration application.

6. The acceleration processing method of claim 1, further comprising obtaining, before combining the first acceleration application and the second acceleration application, acceleration applications comprising the first acceleration application and the second acceleration application.

7. The acceleration processing method of claim 6, further comprising further burning the first combined application to the first acceleration resource according to a preferential allocation scheme.

8. The acceleration processing method of claim 7, wherein the preferential allocation scheme comprises a correspondence between the first acceleration resource and each of the first acceleration application and the second acceleration application.

9. The acceleration processing method of claim 8, wherein the preferential allocation scheme is configured to minimize acceleration resource utilization.

10. An acceleration processing method implemented by an acceleration processing device and comprising:
    combining a first acceleration application and a second acceleration application to obtain a first combined application, wherein the first combined application comprises a top code, the first acceleration application, and the second acceleration application, and wherein the top code comprises a first statement for invoking the first acceleration application and a second statement for invoking the second acceleration application;
    burning the second acceleration application to a first acceleration resource; and after burning the second acceleration application, executing the second acceleration application while simultaneously burning the first combined application to the first acceleration resource.

11. The acceleration processing method of claim 10, further comprising determining, before burning the first combined application, that utilization of using the first acceleration resource by the first combined application is higher than utilization of using a third acceleration resource by the first combined application.

12. The acceleration processing method of claim 10, further comprising obtaining, before combining the first acceleration application and the second acceleration application, acceleration applications comprising the first acceleration application and the second acceleration application.

13. The acceleration processing method of claim 12, further burning the first combined application to the first acceleration resource according to a preferential allocation scheme.

14. The acceleration processing method of claim 13, wherein the preferential allocation scheme comprises a correspondence between the first acceleration resource and each of the first acceleration application and the second acceleration application.

15. The acceleration processing method of claim 14, wherein the preferential allocation scheme is configured to minimize acceleration resource utilization.

16. An acceleration processing device comprising:
a memory configured to store instructions; and
a processor coupled to the memory and configured to execute the instructions to cause the acceleration processing device to:
combine a first acceleration application and a second acceleration application to obtain a first combined application, wherein the first combined application comprises a top code, the first acceleration application, and the second acceleration application, and wherein the top code comprises a first statement for invoking the first acceleration application, a second statement for invoking the second acceleration application, and a port;
burn the first combined application to an area in a first acceleration resource, wherein the first acceleration resource is a field-programmable gate array (FPGA) comprising a pin;
map, after burning the first combined application, the port to the pin;
burn the second acceleration application to the first acceleration resource; and
after burning the second acceleration application, execute the second acceleration application while simultaneously burning the first combined application to the first acceleration resource.

17. The acceleration processing device of claim 16, wherein the processor is further configured to execute the instructions to cause the acceleration processing device to determine, before burning the first combined application, that utilization of using the first acceleration resource by the first combined application is higher than utilization of using a third acceleration resource by the first combined application.

18. The acceleration processing device of claim 16, wherein the processor is further configured to cause the acceleration processing device to obtain, before combining the first acceleration application and the second acceleration application, acceleration applications comprising the first acceleration application and the second acceleration application.

19. The acceleration processing device of claim 18, wherein the processor is further configured to cause the acceleration processing device to further burn the first combined application to the first acceleration resource according to a preferential allocation scheme, wherein the preferential allocation scheme comprises a correspondence between the first acceleration resource and each of the first acceleration application and the second acceleration application.

20. The acceleration processing device of claim 19, wherein the preferential allocation scheme is configured to minimize acceleration resource utilization.

\* \* \* \* \*